United States Patent
Hou et al.

(10) Patent No.: US 11,625,588 B2
(45) Date of Patent: Apr. 11, 2023

(54) NEURON CIRCUIT AND ARTIFICIAL NEURAL NETWORK CHIP

(71) Applicant: Industrial Technology Research Institute, Hsinchu (TW)

(72) Inventors: Tuo-Hung Hou, Hsinchu (TW); Shyh-Shyuan Sheu, Hsinchu County (TW); Jeng-Hua Wei, Taipei (TW); Heng-Yuan Lee, Hsinchu County (TW); Ming-Hung Wu, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 577 days.

(21) Appl. No.: 16/809,522

(22) Filed: Mar. 4, 2020

(65) Prior Publication Data

US 2021/0150317 A1    May 20, 2021

(30) Foreign Application Priority Data

Nov. 18, 2019    (TW) .................................. 108141732

(51) Int. Cl.
     *G06N 3/063*      (2023.01)
     *G06N 3/04*      (2023.01)
     (Continued)

(52) U.S. Cl.
CPC ............... *G06N 3/063* (2013.01); *G06N 3/04* (2013.01); *G06N 3/08* (2013.01); *G11C 11/1693* (2013.01);
(Continued)

(58) Field of Classification Search
CPC ............ G06N 3/063; G06N 3/04; G06N 3/08; G06N 3/049; G06N 3/0635;
(Continued)

(56) References Cited

U.S. PATENT DOCUMENTS 9,792,547 B2    10/2017   Nishitani et al.
9,996,793 B2    6/2018   Eleftheriou et al.
(Continued)

FOREIGN PATENT DOCUMENTS

CN    104916312    9/2015
CN    107615307    1/2018
(Continued)

OTHER PUBLICATIONS

Siorgio Palma et al., "Stochastic neuron design using Conductive Bridge RAM," 2013 IEEE/ACM International Symposium on Nanoscale Architectures (NANOARCH), Jul. 15, 2013, pp. 95-100.
(Continued)

*Primary Examiner* — Ajay Ojha
(74) *Attorney, Agent, or Firm* — JCIPRNET

(57) ABSTRACT

A neuron circuit and an artificial neural network chip are provided. The neuron circuit includes a memristor and an integrator. The memristor generates a pulse train having an oscillation frequency when an applied voltage exceeds a predetermined threshold. The integrator is connected in parallel to the memristor for receiving and accumulating input pulses transmitted by a previous layer network at different times, and driving the memristor to transmit the pulse train to a next layer network when a voltage of the accumulated input pulses exceeds the predetermined threshold.

10 Claims, 7 Drawing Sheets

(51) Int. Cl.
  *G06N 3/08* (2023.01)
  *G11C 11/54* (2006.01)
  *G11C 11/16* (2006.01)
  *G11C 13/00* (2006.01)

(52) U.S. Cl.
  CPC .......... *G11C 11/54* (2013.01); *G11C 13/0004* (2013.01); *G11C 13/0061* (2013.01)

(58) Field of Classification Search
  CPC . G11C 11/1693; G11C 11/54; G11C 13/0004; G11C 13/0061; G11C 2013/0045; G11C 11/1673; G11C 13/004; G11C 2013/0078; G11C 2013/0092; G11C 11/1675; G11C 13/0069
  See application file for complete search history.

(56) References Cited

U.S. PATENT DOCUMENTS

| | | | | |
|---|---|---|---|---|
| 10,217,046 B2* | 2/2019 | Eleftheriou | .......... | G06N 3/0635 |
| 2017/0270404 A1* | 9/2017 | Eleftheriou | ........ | G11C 13/0004 |
| 2018/0260696 A1* | 9/2018 | Suda | ...................... | G06N 3/049 |

FOREIGN PATENT DOCUMENTS

| | | |
|---|---|---|
| CN | 109063833 | 12/2018 |
| CN | 110383301 | 10/2019 |
| TW | 201618509 | 5/2016 |

OTHER PUBLICATIONS

Tomas Tuma et al., "Stochastic phase-change neurons," nature nanotechnology, May 16, 2016, pp. 693-699.

Kibong Moon et al., "High density neuromorphic system with Mo/Pr0.7Ca0.3MnO3 synapse and NbO2 IMT oscillator neuron," 2015 IEEE International Electron Devices Meeting (IEDM), Dec. 7, 2015, pp. IEDM15-463-IEDM15-466.

M. Bavandpour et al., "Mixed-Signal Neuromorphic Inference Accelerators:Recent Results and Future Prospects," 2018 IEEE International Electron Devices Meeting (IEDM),Dec. 1, 2018, pp. 1-4.

Ali Shafiee et al., "ISAAC:A Convolutional Neural Network Accelerator with In-Situ Analog Arithmetic in Crossbars," 2016 ACM/IEEE 43rd Annual International Symposium on Computer Architecture (ISCA),Jun. 18, 2016, pp. 1-13.

"Office Action of Taiwan Counterpart Application", dated Sep. 29, 2020, p. 1-p. 14.

* cited by examiner

NEURON CIRCUIT AND ARTIFICIAL NEURAL NETWORK CHIP

CROSS-REFERENCE TO RELATED APPLICATION

This application claims the priority benefit of Taiwan application no. 108141732, filed on Nov. 18, 2019. The entirety of the above-mentioned patent application is hereby incorporated by reference herein and made a part of this specification.

TECHNICAL FIELD

This disclosure relates to an artificial intelligence technology, and more particularly, to a neuron circuit and an artificial neuron network chip.

BACKGROUND

Hardware acceleration of deep learning is considered the foundation of the future broad artificial intelligence (AI), which encompasses multi-domain, multi-model, and distributed artificial intelligence. Beyond various contemporary digital AI accelerators, artificial neural network (ANN) that utilizes a massively parallel crossbar architecture of non-volatile memory (analogous to synapses) to accelerate matrix multiplication in deep-learning algorithms is highly anticipated because it overcomes the von Neumann bottleneck of inefficient data transfer.

Most ANN studies focus on the realization of high-density synapses for computing. However, recent studies indicate that the peripheral I/O circuits essential for supporting ANN computing, analogous to integrate-and-fire (I&F) neurons in biology, in fact consume even more area and energy than the crossbar array, I&F neurons are often realized via complex digital-to-analog converter/analog-to-digital converter (DAC/ADC) circuits. Recently, several compact neuron circuits have been proposed based on phase-change random access memory/phase-change memory (PRAM/PCM), threshold-switch (TS) devices, and spin-orbit-torque (SOT) magnetoresistive random access memory (MRAM), etc. However, their advantages are largely compromised because an additional reset circuit and/or a sizable capacitor would be required.

SUMMARY

The disclosure provides a neuron circuit, which includes a memristor and an integrator. The memristor generates a pulse train having an oscillation frequency when an applied voltage exceeds a predetermined threshold. The integrator is connected in parallel to the memristor for receiving and accumulating input pulses transmitted by a previous layer network at different times, and driving the memristor to transmit the pulse train to a next layer network when a voltage of the accumulated input pulses exceeds the predetermined threshold.

The disclosure provides a neuron circuit, which includes a memristor and a current-voltage converter. The memristor generates a pulse train having an oscillation frequency when an applied voltage exceeds a predetermined threshold. The current-voltage converter is connected in parallel to the memristor for receiving an input pulse transmitted by a previous layer network, and driving the memristor to transmit the pulse train to a next layer network when a voltage of the input pulse exceeds the predetermined threshold.

The disclosure provides an artificial neural network chip, which includes a synapse array, a plurality of neuron circuits and a control circuit. The synapse array includes n*m synapse elements respectively connecting a plurality of input terminals and a plurality of output terminals. The synapse elements in the same row are connected to the same input terminal, the synapse elements in the same column are connected to the same output terminal, and n and m are positive integers. An input terminal of each of the neuron circuits is connected to one of the output terminals. The control circuit is respectively connected to the input terminals and output terminals of the neuron circuits for adjusting a weight of each of the synapse elements, and monitoring a pulse train transmitted by each of the neuron circuits. Each of the neuron circuits includes a memristor and an integrator. The memristor generates a pulse train having an oscillation frequency when an applied voltage exceeds a predetermined threshold. The integrator is connected in parallel to the memristor for receiving and accumulating input pulses input by the previous layer network through the input terminal and passed through the synaptic element, and driving the memristor to transmit the pulse train to a next layer network when a voltage of the accumulated input pulses exceeds the predetermined threshold.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1:
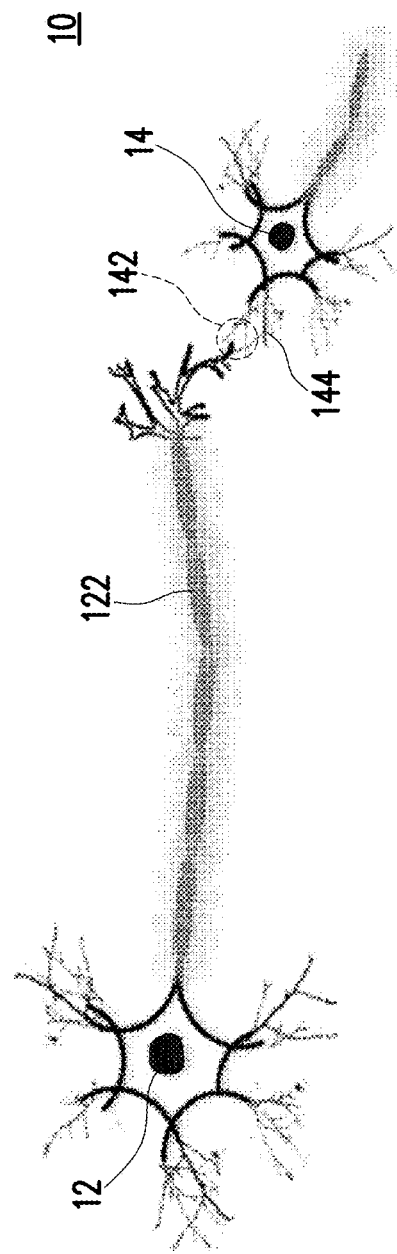
FIG. 1 is architecture of a nervous system according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The embodiments of the disclosure propose a designing method for a neuron circuit in an artificial neural network chip, by which the neuron circuit may be manufactured by utilizing characteristics of memristors emitting pulse waves of different frequencies with operating energy under a specific operating condition, the area of the neuron circuit designed with the traditional complementary metal-oxide semiconductors (CMOS) may be greatly reduced to increases the density of neurons, and the artificial neural network chip with high density operating core may be accomplished with use of a synaptic architecture of the memristor.

FIG. 1 illustrate of architecture of a nervous system according to the disclosure. Referring to FIG. 1, a nervous system 10 enables animals to act or respond to a stimulus, and relies on multiple neurons to transmit signals. A junction between a neuron and a neuron is called a synapse. Neural signals flow from a presynaptic neuron 12 to a postsynaptic neuron 14. A synapse 142 is usually formed between an axon 122 of the presynaptic neuron 12 and a dendrite 144 of the postsynaptic neuron 14, and serves as an input channel of the postsynaptic neuron 14 for receiving the neural signals.

Figure 2:
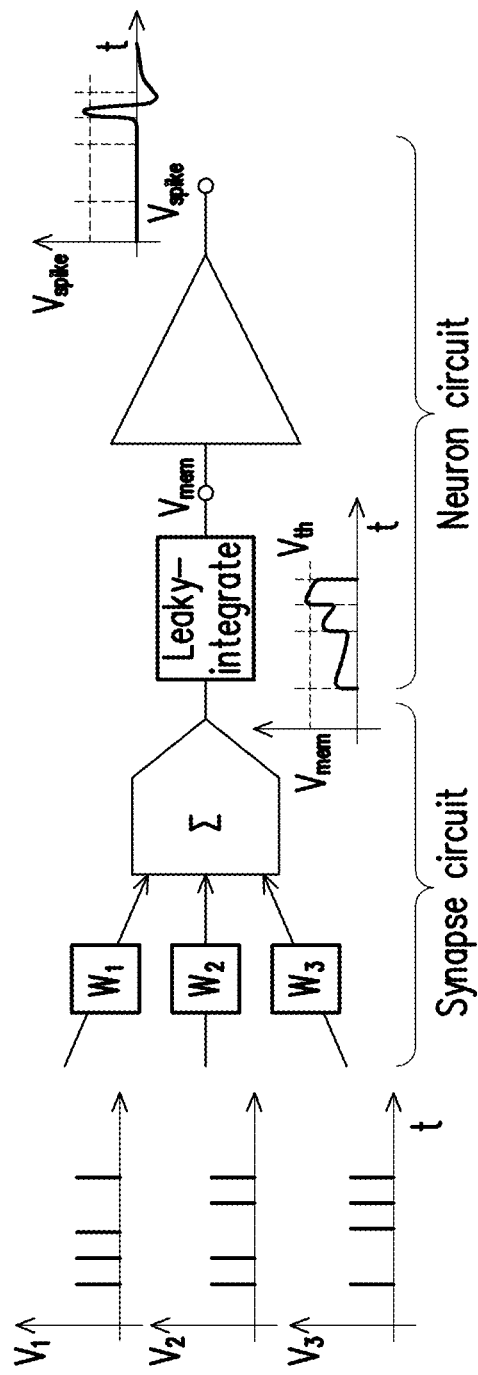
FIG. 2 is a schematic diagram of a signal transfer of an artificial neural network chip illustrated according to an embodiment of the disclosure.

A bionic chip (i.e., the artificial neural network chip described below) is designed based on architecture of the nervous system 10 described above, and usually includes a synapse circuit and a neuron circuit. FIG. 2 is a schematic diagram of a signal transfer of an artificial neural network chip illustrated according to an embodiment of the disclosure. As shown by FIG. 2, the synapse circuit is mainly used to regulate the strength of message transmission between two layer networks, and has a structure that is usually a cross array of memristors. The neuron circuit is used to collect messages from a previous layer network and decide whether to transmit the messages to a next layer network. In an embodiment, the neuron circuit can accumulate pulse voltages $V_1$ to $V_3$ at different time sequences from the previous layer network by using an integration circuit. When an accumulated voltage $V_{mem}$ exceeds a predetermined threshold Vth, the neuron circuit can excite and generate a pulse train $V_{spike}$ for output, and the pulse train $V_{spike}$ is then transmitted to the next layer network.

Figure 3:
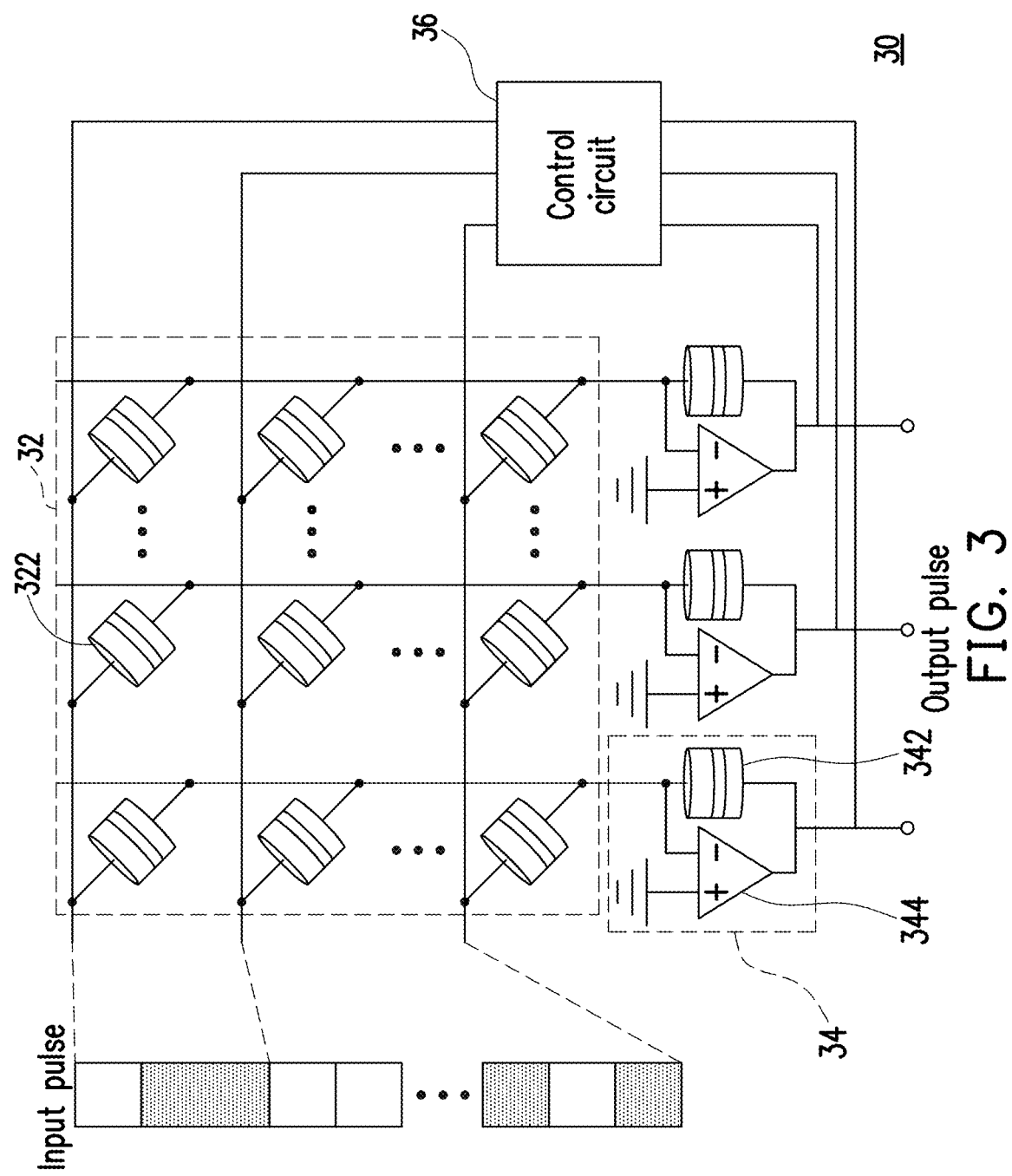
FIG. 3 is a structural diagram of an artificial neural network chip illustrated according to an embodiment of the disclosure.

FIG. 3 is a structural diagram of an artificial neural network chip illustrated according to an embodiment of the disclosure. Referring to FIG. 3, an artificial neural network chip 30 of this embodiment includes a synapse array 32, a plurality of neuron circuits 34 and a control circuit 36.

The synapse array 32 includes n*m synapse elements 322 (memory cells) respectively connecting a plurality of input terminals and a plurality of output terminals. Here, the synapse elements 322 in the same row are connected to the same input terminal, the synapse elements 322 in the same column are connected to the same output terminal, and n and m are positive integers.

An input terminal of each of the neuron circuits 34 is connected to one of the output terminals of the synapse array 32, and the control circuit 36 is respectively connected to the input terminals of the synapse array 32 and output terminals of the neuron circuits 34. The control circuit 36 is, for example, a central processing unit (CPU) or other programmable devices for general purpose or special purpose such as a microprocessor and a digital signal processor (DSP), a programmable controller, an application specific integrated circuit (ASIC), or other similar devices or a combination of above-mentioned devices, which may be used to adjust a weight value of each of the synapse elements 322 and monitor the pulse train transmitted by each of the neuron circuits 34.

Each of the neuron circuits 34 includes a memristor 342 and an integrator 344. The memristor 342 generates a pulse train having an oscillation frequency when an applied voltage exceeds a predetermined threshold. The integrator 344 is connected in parallel to the memristor 342 for receiving and accumulating input pulses input by a previous layer network through the input terminal of the synapse array 32 and passed through the synaptic element 322, and driving the memristor 342 to transmit the pulse train to a next layer network when a voltage of the accumulated input pulses exceeds the predetermined threshold.

In this embodiment, the synapse element 322 in the synapse array 32 is a memristor using the magnetoresistive random access memory (MRAM), for example. However, the disclosure is not limited in this regard. Any memristor that can produce similar characteristics, including a variable resistive random access memory (RRAM), a phase change memory (PCM) or the like, falls within the scope of the disclosure.

Figure 4A:
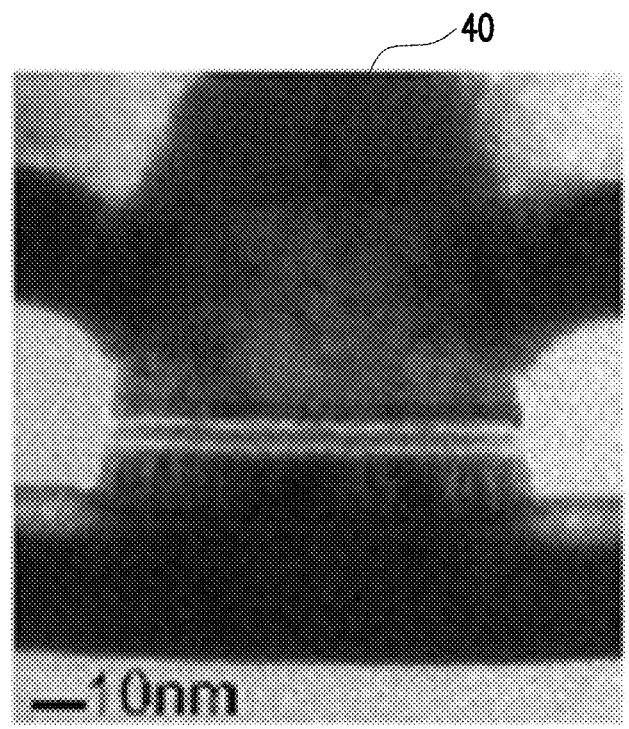
FIG. 4A and FIG. 4B are a transmission electron microscope image and a structural diagram of a magnetoresistive memory illustrated according to an embodiment of the disclosure.
Figure 4B:
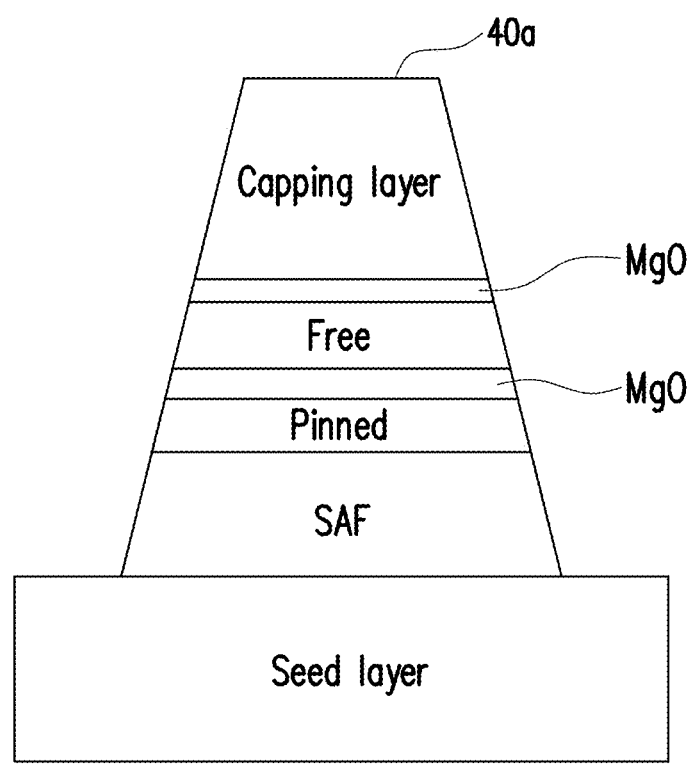

Taking magnetoresistive memory as an example, FIG. 4A and FIG. 4B are a transmission electron microscope (TEM) image and a structural diagram of a magnetoresistive memory illustrated according to an embodiment of the disclosure. As can be seen from a structural diagram 40a of a magnetoresistive memory 40, the magnetoresistive memory 40 is a perpendicular magnetic tunnel junction (pMTJ) with dual-MgO/CoFeB interfaces and a [Co/Pt] multilayer synthetic antiferromagnetic (SAF) based pinned layer and a free layer.

It should be noted that, in Back Hopping (BH) state, because field-like torque competes with spin-transfer torque (STT), the magnetoresistive memory is confronted with a resistance switching oscillation.

Specifically, an embodiment of the disclosure proposes a new type of high-density Integrate-and-Fire (I&F) neuron based on a spin-transfer torque magnetoresistive random access memory (STT-MRAM) technology. The neuron can exploit a Back Hopping (BH) oscillation mechanism in magnetic tunnel junctions (MTJ) to implement current integration, voltage spike generation, state reset in a single device and show an impressive 4-bit resolution. The capacitor-less design without extra reset circuit can ensure the maximum compactness. Additionally, the identical device can also be utilized as a stochastic binary synapse at different bias regimes. An all-spin artificial neural network proposed in an embodiment of the disclosure can be realized in a standard integration flow of embedded STT-MRAM.

Back Hopping describes an abnormal switching back phenomenon during STT-MRAM programming (particularly at high bias). Such phenomenon is typically undesirable for memory operations because it prevents a deterministic STT switching, thus deteriorating the programming yield. However, Back Hopping oscillation is a useful mechanism for realizing I&F neurons. Although the switching is mainly dominated by the spin-transfer torque (STT), many studies have shown the importance of the field-like torque on the energy barrier (EB) and switching dynamics of asymmetric MTJs.

Figure 5:
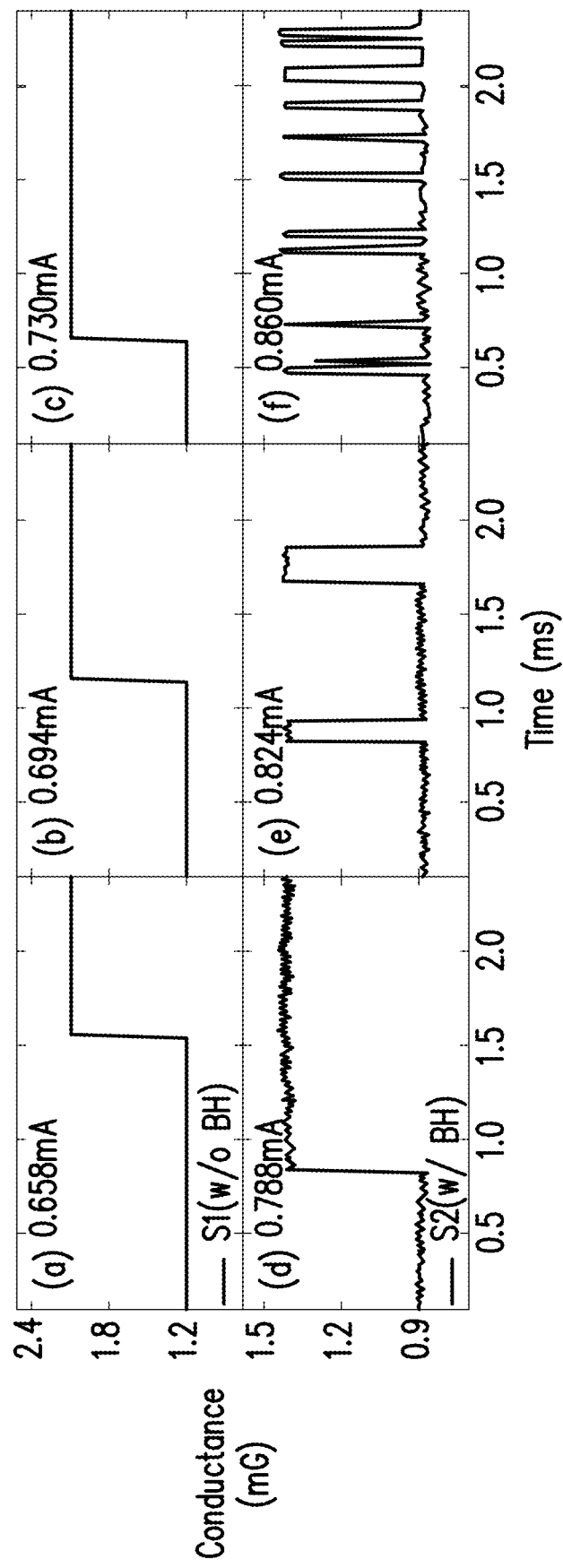
FIG. 5 is a schematic diagram of a resistance oscillation of a magnetoresistive memory in Back Hopping state illustrated according to an embodiment of the disclosure.
Figure 6:
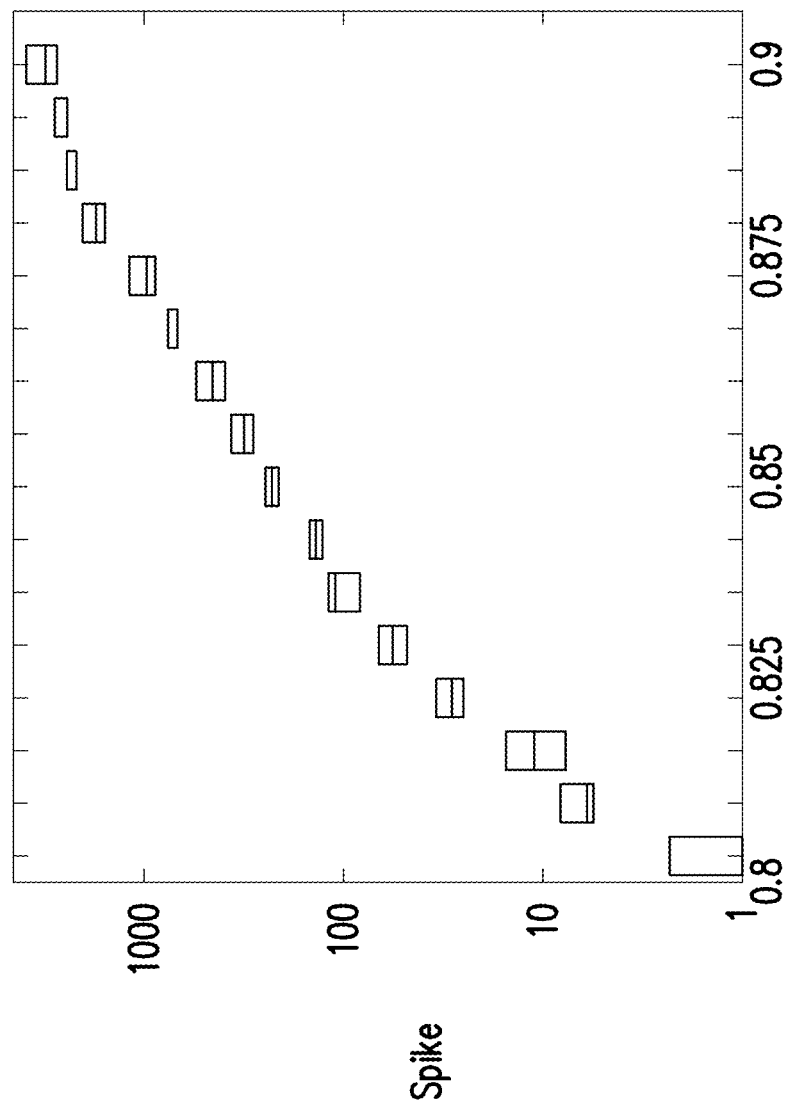
FIG. 6 is a relationship diagram of an oscillation frequency and an operating energy of the magnetoresistive memory illustrated according to an embodiment of the disclosure.

FIG. 5 is a schematic diagram of a resistance oscillation of a magnetoresistive memory in Back Hopping state illustrated according to an embodiment of the disclosure. Referring to FIG. 5, (a) to (c) respectively illustrate binary conductance changes of a standard MTJ (S1) under a constant bias without Back Hopping characteristics, and (d)

to (f) respectively illustrate binary conductance changes of a tailored MTJ (S2) under a constant bias with Back Hopping characteristics. In comparison with S1 that always shows a stable antiparallel (AP) to parallel (P) switching, S2 shows intriguing spikes above a certain threshold current due to a stochastic oscillation between AP and P states Here, an oscillation frequency of S2 is related to an operating energy. As the energy becomes higher, the oscillating frequency becomes larger and the number of spikes also increases, as shown by FIG. 6.

Figure 7A:
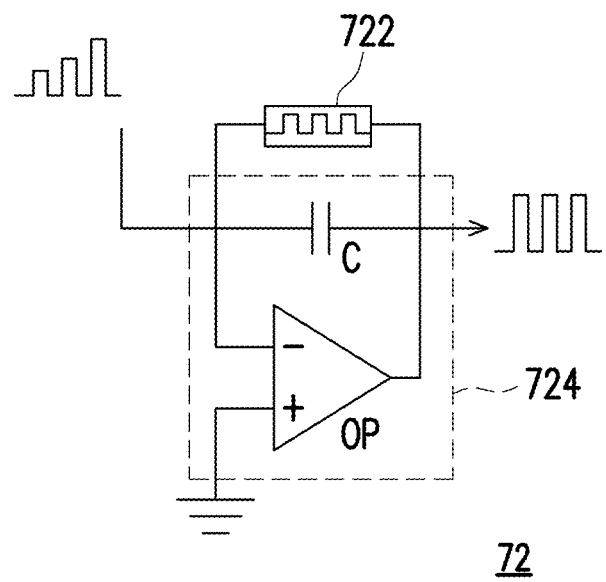
FIGS. 7A and 7B are circuit diagrams of a neuron circuit illustrated according to an embodiment of the disclosure.

The present embodiment of the disclosure uses the operating characteristics of the magnetoresistive memory under Back Hopping. In the bionic chip which needs to accumulate pulse voltages input by the previous layer network related to time, a neuron circuit architecture shown by FIG. 7A is adopted to replace a reset and threshold determination circuit of the traditional neuron circuit. Alternatively, in an artificial neural network chip that only needs to accumulate a pulse voltage currently input by the previous layer network, a neuron circuit architecture as shown by FIG. 7B is adopted as an activation function.

Figure 7B:
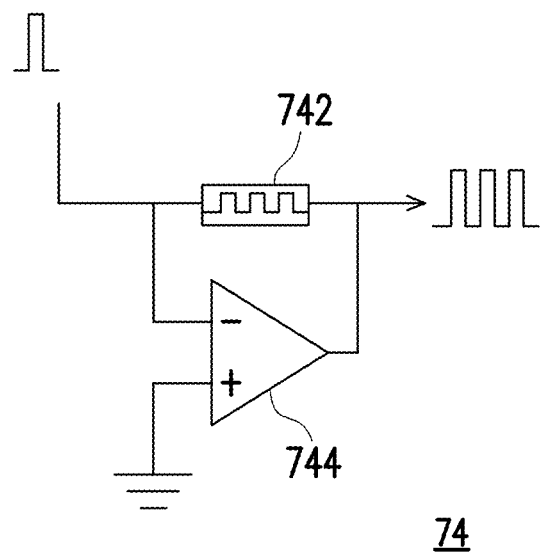

In detail, FIGS. 7A and 7B are circuit diagrams of a neuron circuit illustrated according to an embodiment of the disclosure. A neuron circuit 72 of FIG. 7A includes a memristor 722 and an integrator 724. Here, the memristor 722 is, for example, a magnetoresistive random access memory, a variable resistive random access memory or a phase-change memory, and the integrator 724 is realized by, for example, an operational amplifier OP in combination with a capacitor C and a resistor (not illustrated). However, the disclosure is not limited in this regard. The memristor 722 generates a pulse train having an oscillation frequency when an applied voltage exceeds a predetermined threshold. The integrator 724 is connected in parallel to the memristor 722 for receiving and accumulating input pulses transmitted by a previous layer network at different times, and driving the memristor 722 to transmit the pulse train to a next layer network when a voltage of the accumulated input pulses exceeds the predetermined threshold.

A neuron circuit 74 of FIG. 7B includes a memristor 742 and a current-voltage converter 744. Here, the memristor 742 is, for example, a magnetoresistive random access memory, a variable resistive random access memory or a phase-change memory, and the current-voltage converter 744 is realized by, for example, an operational amplifier in combination with a resistor (not illustrated). However, the disclosure is not limited in this regard. The memristor 742 generates a pulse train having an oscillation frequency when an applied voltage exceeds a predetermined threshold. The current-voltage converter 744 is connected in parallel to the memristor 742 for receiving an input pulse transmitted by a previous layer network, and driving the memristor 742 to transmit the pulse train to a next layer network when a voltage of the input pulse exceeds the predetermined threshold.

In summary, the neuron circuit and the artificial neural network chip of the disclosure can ensure the maximum compactness of the neurons by a unique current-driven Back Hopping (BH) oscillation of the memristor without having additional capacitor or reset circuit disposed. The feasibility of deep-learning acceleration based on the compact all-spin artificial neural network (ANN), the analog integrate-and-fire (I&F) neuron, and the stochastic binary synapse has also been demonstrated using the spin-transfer torque magnetoresistive random access memory (STT-MRAM) technology.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A neuron circuit, comprising:
   a memristor, generating a pulse train having an oscillation frequency when an applied voltage exceeds a predetermined threshold; and
   an integrator, connected in parallel to the memristor for receiving and accumulating input pulses transmitted by a previous layer network at different times, and driving the memristor to transmit the pulse train to a next layer network when a voltage of the accumulated input pulses exceeds the predetermined threshold.

2. The neuron circuit according to claim 1, wherein a frequency of the pulse train is related to an operating energy of the memristor.

3. The neuron circuit according to claim 1, wherein the memristor comprises a magnetoresistive random access memory (MRAM), a variable resistive random access memory (RRAM) or a phase-change memory (PCM).

4. A neuron circuit, comprising:
   a memristor, generating a pulse train having an oscillation frequency when an applied voltage exceeds a predetermined threshold; and
   a current-voltage converter, connected in parallel to the memristor for receiving an input pulse transmitted by a previous layer network, and driving the memristor to transmit the pulse train to a next layer network when a voltage of the input pulse exceeds the predetermined threshold.

5. The neuron circuit according to claim 4, wherein a frequency of the pulse train is related to an operating energy of the memristor.

6. The neuron circuit according to claim 5, wherein the memristor comprises a magnetoresistive random access memory, a variable resistive random access memory or a phase-change memory.

7. An artificial neural network chip, comprising:
   a synapse array, comprising n*m synapse elements respectively connecting a plurality of input terminals and a plurality of output terminals, wherein the synapse elements in the same row are connected to the same input terminal, the synapse elements in the same column are connected to the same output terminal, and n and m are positive integers;
   a plurality of neuron circuits, an input terminal of each of the neuron circuits is connected to one of the output terminals; and
   a control circuit, respectively connected to the input terminals and output terminals of the neuron circuits for adjusting a weight of each of the synapse elements, and monitoring a pulse train transmitted by each of the neuron circuits, wherein
   each of the neuron circuits comprises:
      a memristor, generating a pulse train having an oscillation frequency when an applied voltage exceeds a predetermined threshold; and
      an integrator, connected in parallel to the memristor for receiving and accumulating input pulses input by a previous layer network through the input terminal and passed through the synaptic element, and driving the memristor to transmit the pulse train to a next layer network when a voltage of the accumulated input pulses exceeds the predetermined threshold.

8. The artificial neural network chip according to claim 7, wherein the integrator is realized by a current-voltage converter, and drives the memristor to transmit the pulse train to the next layer network when a voltage of the input pulses input by the previous layer network through the input terminal and passed through the synaptic element exceeds the predetermined threshold.

9. The artificial neural network chip according to claim 7, wherein the synapse elements are realized by memristors.

10. The artificial neural network chip according to claim 7, wherein the memristor comprises a magnetoresistive random access memory, a variable resistive random access memory or a phase-change memory.

* * * * *